United States Patent [19]

Baliga et al.

[11] Patent Number: 4,933,740
[45] Date of Patent: Jun. 12, 1990

[54] INSULATED GATE TRANSISTOR WITH VERTICAL INTEGRAL DIODE AND METHOD OF FABRICATION

[75] Inventors: Bantval J. Baliga, Schenectady, N.Y.; Andrew L. Robinson, Ann Arbor, Mich.

[73] Assignee: General Electric Company, Schenectady, N.Y.

[21] Appl. No.: 243,211

[22] Filed: Sep. 9, 1988

Related U.S. Application Data

[63] Continuation of Ser. No. 935,368, Nov. 26, 1986, abandoned.

[51] Int. Cl.$^5$ .............................................. H01L 29/74
[52] U.S. Cl. .......................................... 357/38; 357/20; 357/23.4; 357/23.8; 357/43; 357/86
[58] Field of Search .................... 357/23.4, 38, 43, 86, 357/23.8, 20

[56] References Cited

U.S. PATENT DOCUMENTS

| | | | |
|---|---|---|---|
| 4,376,286 | 3/1983 | Lidow et al. | 357/23.4 |
| 4,422,089 | 12/1983 | Vaes et al. | 357/23.4 |

FOREIGN PATENT DOCUMENTS

| | | |
|---|---|---|
| 0111803 | 6/1984 | European Pat. Off. . |
| 0115098 | 8/1984 | European Pat. Off. . |
| 57-12558 | 1/1982 | Japan .................. 357/23.8 |
| 2150753 | 10/1984 | United Kingdom . |

OTHER PUBLICATIONS

Article "Analysis of the Lateral Insulated Gate Transistor" by M. R. Simpson, P. A. Gough, F. I. Hshieh and V. Rumennik published in the Technical Digest of the International Electron Device Meeting, 1985, pp. 740-743.

Primary Examiner—Joseph E. Clawson, Jr.
Attorney, Agent, or Firm—Robert Ochis; James C. Davis, Jr.; Marvin Snyder

[57] ABSTRACT

An improved lateral insulated gate transistor includes a dual function anode and employs specially configured anode and cathode regions within the drift layer to promote lateral current flow. A vertical diode is disposed between a substrate cathode and anode of the device. Under forward bias conditions, the device exhibits insulated gate controlled conduction, and under reverse bias conditions, the device exhibits conduction between the substrate cathode and anode of the vertical diode.

24 Claims, 4 Drawing Sheets

PREVIOUSLY PROPOSED DEVICE

SIMPSON, et.al.

INSULATED GATE TRANSISTOR WITH VERTICAL INTEGRAL DIODE AND METHOD OF FABRICATION

This application is a continuation of application Ser. No. 935,368, filed Nov. 26, 1986, now abandoned.

RELATED APPLICATIONS

This application is related to U.S. patent application Ser. No. 803,049 for a "Lateral Insulated Gate Transistor With Improved Latch Up Immunity", filed on Nov. 29, 1985 and assigned to the assignee of the present invention and the entirety of which is incorporated by reference herein.

BACKGROUND OF THE INVENTION

It has been suggested that an improved conductivity lateral insulated gate transistor can be achieved by the addition of a split or dual conductivity anode to establish a lateral diode current path between the cathode and anode. FIGS. 1 and 2 of this application show alternate forms of these devices. Heretofore efforts to establish such a lateral diode current have been unsuccessful inasmuch as the lateral current flow has been established only at the expense of device performance.

FIG. 1 is an example of one such previously proposed dual anode insulated gate transistor wherein the conventional anode has been replaced with an anode comprising alternate conductivity type emitter regions illustrated as P and N type conductivity regions. It has been suggested that a lateral diode current can be established from the P+ base region to the N+ anode region. A metal layer is disposed over and in ohmic electrical contact with both N+ and P+ emitter regions to function as an anode electrode and also to short the emitter regions to each other to prevent diode action between them. This particular structure, however, has been found inadequate to provide the proposed lateral diode action without also degrading the operation of the insulated gate transistor. More particularly, the N+ portion of the anode acts as a collector and collects a sufficient amount of the lateral electron current to short out the effectiveness of the P+ portion of the anode and thus suppress the injection of minority carriers from the P+ anode into the N drift layer during the on-state operation of the device. Consequently, this previously proposed device cannot provide for low resistance reverse conduction without impairing the enhanced conductivity characteristic of a lateral insulated gate transistor which is attributable to the bipolar conduction achieved by minority carrier injection. The previously proposed structure degrades the drift layer conductivity modulation essential to lateral insulated gate transistor performance.

Another proposed design has been disclosed in the article "Analysis of the Lateral Insulated Gate Transistor" by M. R. Simpson, P. A. Gough, F. I. Hshieh and V. Rumennik published in the Technical Digest of the International Electron Device Meeting, 1985, pages 740–743. An illustration of the first figure of this article is shown as FIG. 2 of this application. In particular, this article proposes to provide a substrate having a thickness of approximately 300 microns and an electrical terminal for grounding. A thin drift layer is provided atop the substrate. A large and heavily doped deep P+ region adjacent a smaller and shallower heavily doped N+ region is provided within the drift layer. This article discloses that the current voltage characteristic of the proposed device, has a pronounced on-state knee at approximately 1.2 volts. After the voltage is increased beyond 1.2 volts, the current gradually increases. Thus, the operating characteristic of this proposed device is in marked contrast to the operating characteristic of a conventional lateral insulated gate transistor in which the on-state knee occurs at 0.7 volts and thereafter the current rapidly increases. The higher on-state knee voltage of the Simpson et al. design is caused by the electron current bypassing the anode junction between the P+ region and the N drift layer. The electron current flows under the P+ anode region to the N+ anode region. In this prior device the leading edge of the P+ region has been placed in close proximity to the N+ region. The pinch resistance $R_p$ in the drift region beneath the anode is small, and consequently a large electron current must flow before the junction becomes forward biased. Simpson et al. have reported that when the lateral voltage drop exceeds 1.2 volts between the cathode and the anode, the PN junction between the P+ anode and the N type drift layer will become sufficiently forward biased to inject minority carriers into the drift layer to establish bipolar conduction in the lateral insulated gate transistor device. Before such proposed device achieves the 1.2 volt drop, however, the P-N junction between the P+ anode and the drift layer does not inject enough minority carriers to modulate the conductivity of the drift layer. Therefore, this prior device is current controlled inasmuch as it requires a large level of current flow before minority carrier junction is established.

There thus exists an unfilled need to provide a lateral insulated gate transistor structure containing a reverse conducting diode integral therein without degrading of the forward conduction characteristic of the lateral insulated gate transistor.

OBJECTS OF THE INVENTION

A principal object of the present invention is to provide a new and improved lateral insulated gate semiconductor device having a vertical diode integral therein and exhibiting a reverse conducting capability.

It is a further object of the present invention to provide an improved lateral insulated gate semiconductor device having an operating characteristic exhibiting an on-state threshold of approximately 0.7 volts with a rapidly increasing current level above the threshold.

A still further object of the present invention is to provide an improved semiconductor de includes a vertically oriented, normally reversed biased diode between the anode and substrate cathode regions to permit reverse current conduction through the device in response to the application of a reverse bias potential to the device.

A still further object of the present invention is to control the doping concentration and depths of the various regions in a lateral insulated gate semiconductor device to minimize the resistance of the lateral current path and to minimize the on-state threshold of the device.

SUMMARY OF THE INVENTION

These and other objects and features of the present inventions are achieved in a lateral insulated gate controlled semiconductor device such as an insulated gate transistor comprising a substrate of one type conductivity and having a drift layer of opposite type conductivity disposed thereon. A portion of the substrate adjacent to a first surface of the device can be heavily doped to facilitate ohmic contact to a substrate cathode electrode while a second portion of the substrate interior of the first surface of the device can be lightly doped. The drift layer can be epitaxially grown on the substrate and can be lightly doped. The anode portion of the device comprises first and second regions. The first region is of one type conductivity and is disposed within the drift layer. The second region is of opposite type conductivity and is also disposed within the drift layer. The first region is comprised of two zones. The first zone is a central zone which surrounds the second region and is preferably located at the bonding pad. The second zone of the first region is a finger-like appendage which protrudes outwardly from the first or central zone and away from the second region. It is preferred that the first region exhibit a lateral length L which is sufficient to establish a voltage drop in excess of 0.7 volts in response to a flow of electrons within the drift region along the length of the finger-like second zone. A voltage drop in excess of 0.7 volts causes the first region to provide minority carrier injection characteristics of insulated gate transistor devices. It is preferred that the first and second regions and the drift layer advantageously form a portion of a second surface of the device, and an anode electrode advantageously ohmically electrically contacts both the first and second regions. An anode electrode can be disposed on the second surface and in ohmic electric contact with the first and second regions. The first and second regions can be disposed within a buffer region of opposite type conductivity, itself situated within the drift layer of the device.

The device also includes two cathode regions. The first cathode region is associated with a vertical diode and comprises a portion of the one type conductivity substrate while the second cathode comprises third and fourth regions. The third region is of one type conductivity, and is disposed within and forms a PN junction with the first layer. A fourth region of opposite type conductivity is disposed within the third region. In a preferred embodiment, the third region comprises a deep, heavily doped central portion which is surrounded by a shallow, lightly doped appendage. A second cathode electrode makes ohmic electric contact with the third and fourth regions and an insulated gate structure is disposed over the third region and advantageously also over a portion of the fourth region and the drift layer such that in response to an appropriate bias applied to the gate, a channel is established through the third region to allow opposite type conductivity carriers to flow from the fourth region through the channel of the third region into the drift layer and thence to the anode electrode. As a result of the aforedescribed opposite type conductivity carrier current flow, a voltage drop occurs in the drift layer and a potential between the first region and the drift layer is established such that the PN junction between the first region and the drift layer becomes forward biased, causing the first region to inject one type conductivity carriers into the drift layer to facilitate bipolar conduction wherein one type conductivity carrier current flows from the first region through the drift layer to the third region and thence to the second cathode electrode.

In a preferred embodiment, the first cathode electrode makes ohmic contact with the portion of the substrate, forming a first surface of the device, and means are provided for coupling the first cathode electrode to the second cathode electrode disposed on the second surface of the device. This means for coupling can comprise an electrical connection through the device substrate and/or a circuit path external to the substrate to thus interconnect the first and second cathodes and thereby establish a vertical diode current path between the substrate and the second region of the device. In response to a reverse bias potential applied between the anode and the first and second cathode electrodes of the device, the vertical diode becomes forward biased and a large current flows between the first cathode and the anode electrodes through the substrate layer, drift layer and second region.

The present invention provides an improved conductivity, insulated gate semiconductor device. The drift layer of the device, as a result of the uniquely structured anode, experiences increased conductivity resulting from minority carrier injection, to make a substantial contribution to the conductivity of the device. In particular, the anode is specially structured to provide a second region of opposite type conductivity which is disposed beneath the anode terminal bonding pad of the device to minimize the device area required by this region. The first region is specially configured to include a plurality of oppositely directed, approximately parallel appendages or fingers which extend outwardly from the anode toward the first cathode of the device. In a preferred embodiment, the second region, and particularly the fingers thereof, extend from the second surface of the device to a depth which is less than the maximum depth of the second region. These one type conductivity fingers facilitate minority carrier injection between each finger and the drift layer of the device to reduce the drift resistance. The cathode and gate regions of the device can be interdigitated with the fingers of the first region. Thus, the proposed structure provides characteristic lateral insulated gate transistor conduction under forward biased conditions and diode type conduction under reverse bias conditions.

In a further aspect of the present invention, a method of fabricating an improved semiconductor device is provided. Initially, a semiconductor substrate of one type conductivity is provided. A first lightly doped layer of opposite type conductivity is formed atop the substrate by, for instance, using either doping techniques or epitaxial growth. A buffer region, also of opposite type conductivity and more heavily doped than the first layer, can also be established within the first layer. A first region of one type conductivity is formed in the first layer, and a second region of opposite type conductivity is formed in the first region and the first layer. If the buffer region is present, it is preferred that the first and second regions be formed within the buffer region. A third region of one type conductivity is also formed in the first layer. It is preferred that the third region be comprised of a heavily doped central region surrounded by a lightly doped one type conductivity appendage. A fourth region is disposed within the third region. The fourth region, in combination with the first layer, defines a channel portion of the third region therebetween. A first cathode electrode is disposed in ohmic contact with the third and fourth regions. An insulated gate structure is provided over the channel portion of the third region and preferably overlaps onto the fourth region and the first layer. The insulated gate structure comprises an insulation layer and a gate electrode atop the insulation layer.

A second cathode electrode is disposed in ohmic contact with the substrate and an electrical connection is established between the first and second cathode electrodes. It is also preferred that a portion of the first region be interdigitated with a portion of the third region and that the second region be established with a depth which is greater than the depth of the first region.

The present invention thus provides for an improved lateral insulated gate semiconductor device having a vertical diode therein. Improvements in conductivity allow reduced cell size and reduced cell repeat distance, so that a larger number of cells may be disposed within a given unit of area and the disclosed lateral insulated gate transistor may be operated with an improved current density. Moreover, these improvements are achieved without significant deterioration or negative impact on other device parameters such as on resistance or on-voltage threshold.

BRIEF DESCRIPTION OF THE DRAWINGS

The features of the present invention which are believed novel are specified with particularity in the appended claims. The invention itself, however, both as to organization and method of operation together with additional features, objects and advantages of the improved lateral insulated gate transistor with dual function anode and vertical integral diode can be best understood by reference to the following detailed description when taken in conjunction with the accompanying drawings in which:

DETAILED DESCRIPTION OF THE PREFERRED EMBODIMENTS

Figure 1:
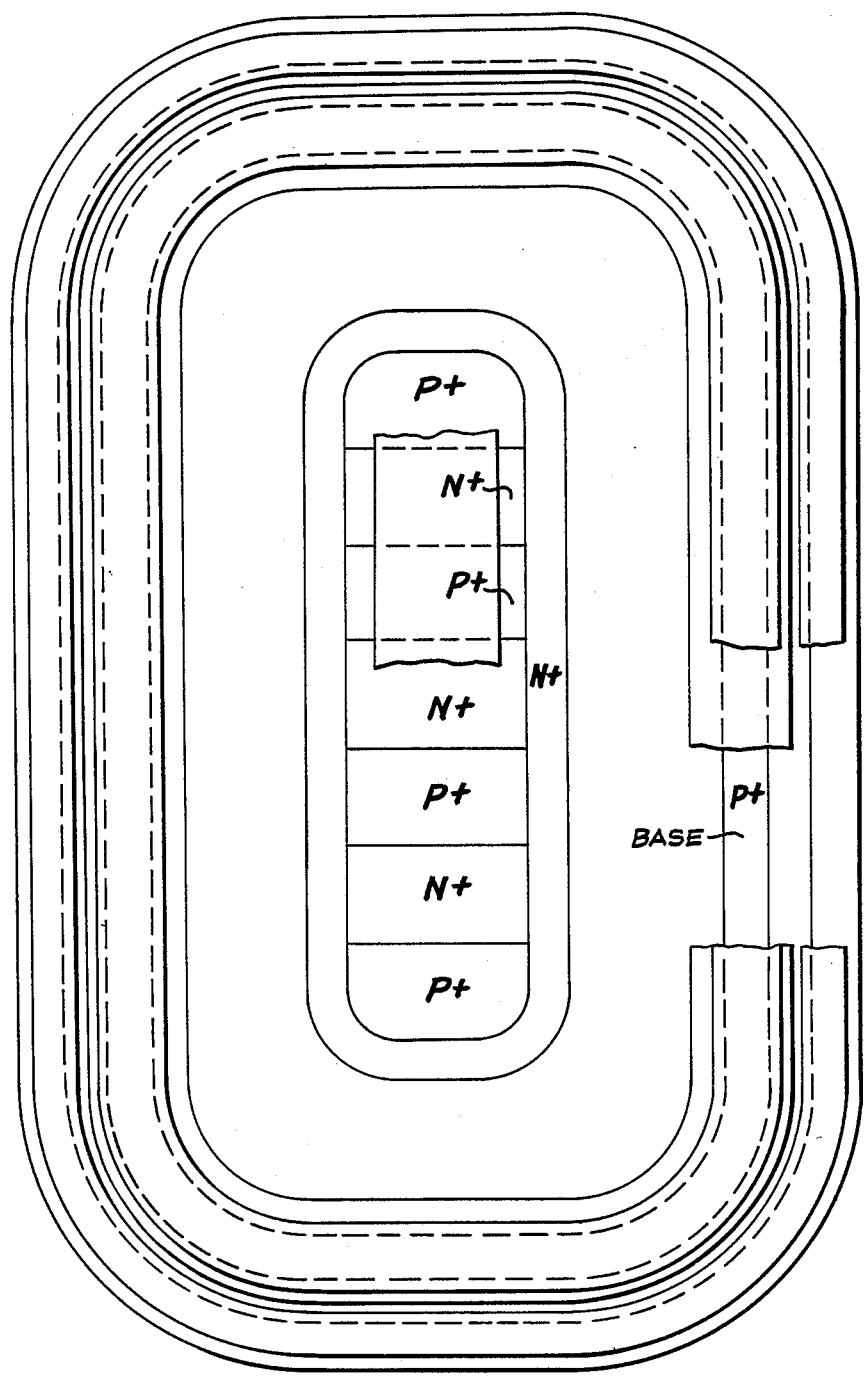
FIG. 1 is a top plan view of one previously proposed lateral insulated gate transistor employing a lateral diode.
Figure 2:
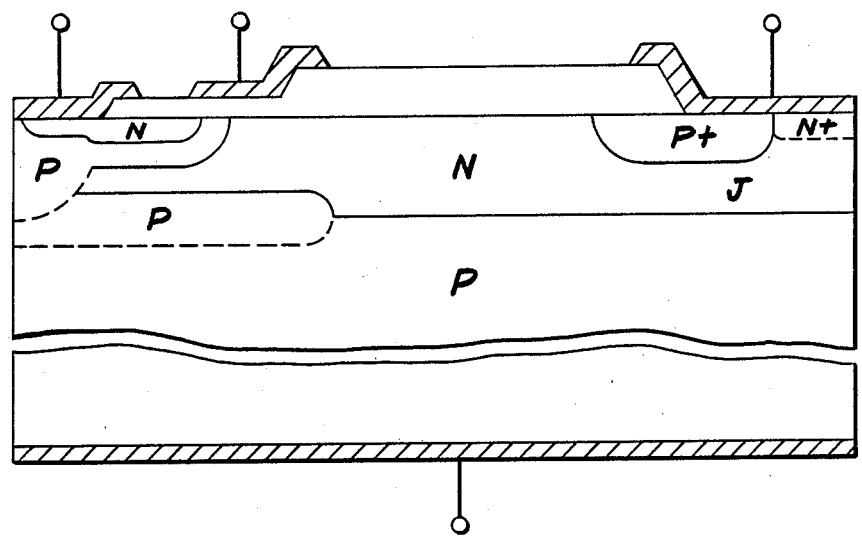
FIG. 2 is a cross-sectional illustration of another previously proposed lateral insulated gate transistor.

The dual function anode structure of the present invention which, includes a vertical integral diode within a lateral insulated gate transistor is applicable to a broad range of insulated gate semiconductor devices which can be fabricated from a variety of different semiconductor materials. The ensuing description discloses several preferred embodiments of the improved lateral insulated gate semiconductor device of the present invention implemented in a silicon substrate because silicon devices or devices fabricated in silicon substrates make up an overwhelming majority of the currently available semiconductor devices. Consequently, the most commonly encountered applications of the present invention will involve silicon substrates. Nevertheless, the invention disclosed herein can be advantageously employed in other semiconductor materials such as germanium or gallium arsenide and is equally applicable to other semiconductor technologies. Accordingly, the present invention is not limited to devices fabricated in silicon substrates, but instead encompasses those devices fabricated in any number of materials.

Moreover, while the present disclosure presents a number of examples including silicon substrates, these examples should be considered as illustrative examples of the preferred embodiments and not as limitations on the scope or applicability of the present invention. Moreover, while the illustrated examples include the improved dual function anode vertical diode structure within a lateral insulated gate transistor, it is recognized that the present invention has applicability to other lateral type structures. Further, while the present invention provides for improved current conductivity and current density, the attendant benefits of reduced cell size and reduced cell repeat distance will also result in improved cell density.

Given the corresponding relationship of FIGS. 1–4, corresponding parts have been designated with the same reference numerals as an aid to understanding the description of the present invention. Various parts of the semiconductor elements however, have not been drawn to scale. Certain dimensions have been exaggerated in relation to other dimensions in order to present a clearer illustration and understanding of the invention. Although, for the purposes of illustration, the preferred embodiment of the improved lateral insulated gate transistor with dual function anode and vertical integral diode of the present invention has been shown in each particular embodiment to include specific P and N type regions, it will be understood by those skilled in the art that the teachings herein are equally applicable to lateral insulated gate devices in which the conductivities of the various regions have been reversed to, for instance, provide for a dual of the illustrated device.

Further, although the embodiments illustrated herein are shown in two dimensional views, the various regions of the device have width, length and depth. It is to be understood that these regions are illustrations of only a portion of a single cell of a device which is comprised of a plurality of cells arranged in a three dimensional structure. Accordingly, these regions when fabricated in actual devices, would generally comprise a plurality of these regions having three dimensions including length, width, and depth.

Figure 3:
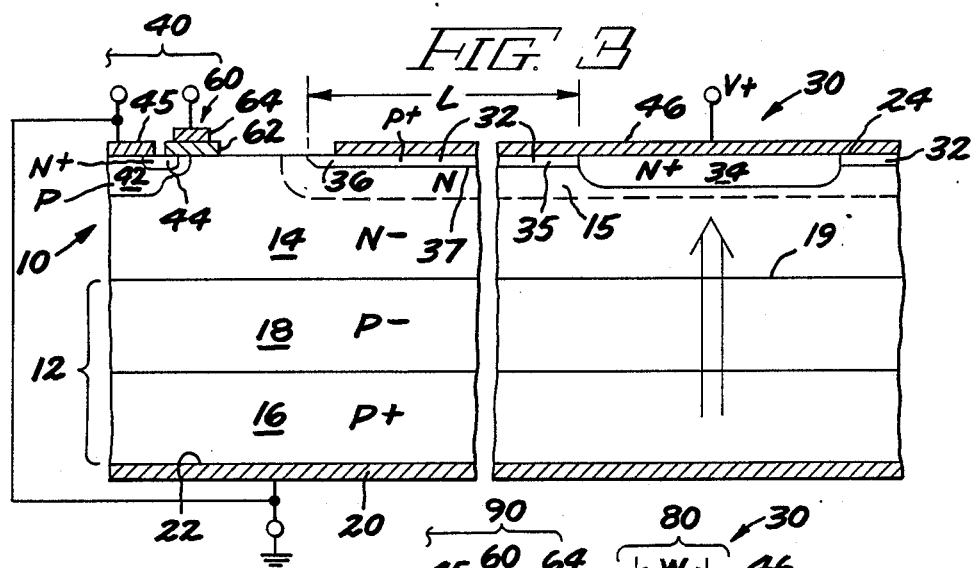
FIG. 3 is a cross-sectional illustration of an improved lateral insulated gate transistor with dual function anode and vertical integral diode in accordance with the present invention, and represents a view taken along the line 3—3 of FIG. 5.

Referring now to FIG. 3, a preferred embodiment of a lateral insulated gate transistor having a dual function anode and a vertical integral diode 10 in accordance with the present invention is shown in vertical cross section. This section is taken through line 3—3 of FIG. 5 which is described below. The device 10 comprises a substrate 12 of one type conductivity illustrated as a P type layer. The substrate 12 can be thin to provide good diode conduction as is discussed below. An opposite type conductivity drift layer 14 illustrated as a lightly doped N type conductivity drift layer is disposed thereon. The substrate 12 forms a first surface 22 of the device 10. The substrate 12 can comprise a heavily doped first portion 16 adjacent the first surface 22 and a lightly doped second portion 18 disposed thereon. A first cathode electrode 20 can advantageously be ohmically connected to the substrate 12 on the first surface 22 of the substrate 12. In a preferred embodiment, the drift layer 14 forms a portion of a second surface 24 of the device 10 and is advantageously an epitaxial layer although this drift layer 14 can alternatively be established by doping techniques such as implantation or diffusion. A portion of the drift layer 14 can be more heavily doped to establish an opposite type conductivity buffer region 15 to prevent punchthrough from the substrate 12 to the anode 32. The anode structure 30 of the improved lateral insulated gate transistor of the present invention comprises first and second regions 32 and 34 respectively, each extending from the second surface 24. The first region 32 comprises a heavily doped region of one type conductivity, shown as a P+ region which surrounds, at the surface 24, a second heavily doped opposite type conductivity region 34, illustrated as a centrally disposed N+ region. The first region 32 forms a PN junction 37 with the buffer region 15.

The configuration of the first region 32 is of critical importance to the effective operation of the present invention because it enables the device 10 to overcome many of the aforementioned problems and to retain capability for minority carrier injection into the drift layer 14 of the device 10. The specially configured first region 32 disposed about the periphery of the second region 34 develops a voltage drop along the fingers which is sufficient to forward bias the junction 37 to thereby provide minority carrier injection. Thus, the specially configured first region enables the improved lateral insulated gate transistor with vertical integral diode of the present invention to operate without requiring a large current flow to overcome a relatively high voltage knee representing the on-voltage threshold of the device.

The first region 32 comprises a central portion 35 abutting, and and at the surface 24 surrounding, the perimeter of the second region 34. The first region 32 also includes a peripheral region comprising a plurality of appendages 36 illustrated as a plurality of fingers extending outwardly from the perimeter of second region 34 and disposed in an approximately parallel opposed relationship pointing generally in the direction of, and interdigitated with a second cathode 40 which is described below. The first region 32 is preferably shallower than the second region 34 and does not extend beneath the second region 34. The length L of each appendage 36 is designed to provide a voltage drop along the length of the appendage which, under normal operating circumstances, is of sufficient magnitude to forward bias the PN function 37 between the first region 32 and the drift layer 14. In a preferred embodiment, the first region 32 is fabricated to provide a voltage drop slightly in excess of approximately 0.7 volts. In a preferred 100 amp/cm embodiment, the appendage 80 has as an aspect ratio approximately equal to 25, which is the ratio of its length L (shown in FIG. 3) to its width W (shown in FIG. 6). In a preferred embodiment, the length L of the appendage is approximately 10–100 mils and the width W is selected to be approximately 0.5–1 mils.

The entire second region 34 can be situated beneath anode electrode pad 46 (discussed below) and thus the addition of the second region 34 and the inclusion of a vertical diode within the device 10 of the present invention, represented by PN junction 19 beneath anode region 34, does not require the use of additional device surface area or "real estate". Instead, the improved semiconductor device of the present invention can be implemented in a unit cell having the dimensions of a standard unit cell.

The second cathode 40 of the lateral device 10 generally comprises a third region 42 of one type conductivity disposed within the drift layer 14 and shown as a specially configured P type region. The third region 42 can comprise a heavily doped central portion which is surrounded by a lightly doped appendage. The configuration of the third region 42 is discussed in more detail in U.S. patent application Ser. No. 803,049 for a "Lateral Insulated Gate Transistor With Improved Latch Up Immunity" filed on Nov. 19, 1985 and assigned to the assignee of the present invention, the totality of which is expressly incorporated herein by reference. A fourth region 44 of opposite type conductivity, illustrated as a heavily doped N+ region, is disposed within the third region 42. A second cathode electrode 45, comprising a metal such as aluminum, is disposed in ohmic contact with the third and fourth regions 42 and 44, respectively.

In the illustrated embodiment, the first, second, third, fourth, buffer and drift regions 32, 34, 42, 44, 15 and 14, respectively all form a portion of a second surface 24 of the lateral insulated gate transistor device of the present invention.

An anode electrode 46, comprising a metal such as aluminum, is disposed over, and in ohmic contact with, the first and second regions 32 and 34 respectively, to thereby short the PN junction between the first and second regions 32 and 34 respectively, to prevent the occurrence of undesired diode action therebetween.

The second cathode electrode 45 comprises a metal, such as aluminum, and is disposed over and in ohmic electric contact with, the third and fourth regions 42 and 44, respectively. The cathode electrode 45 serves to short the PN junction between these regions to avoid inadvertent forward biasing of this junction which can cause latch up of the device. The previously discussed first cathode electrode 20 can be electrically connected to the second cathode electrode 45 by a connection (not shown) through the device 10 and/or alternatively, by a connection (not shown) external to the device 10 to establish an improved lateral insulated gate transistor with dual function anode and vertical integral diode in accordance with the present invention. In this regard, it is noted that in contrast to the device disclosed in the aforementioned U.S. patent application Ser. No. 803,049, in which the cathode electrode is separated from the anode by three semiconductor regions such as PNP regions and two PN blocking junctions, in the device of the present invention, the first cathode electrode 20 is separated from the anode electrode 46 by only two dissimilar semiconductor layers 12 and 14 and a single PN junction 19 therebetween. Thus the present invention utilizes the substrate cathode-anode current path (represented by the vertical arrow) to facilitate low on threshold current flow within the lateral insulated gate transistor of the present invention under reverse biased conditions. It is to be noted that in the illustrated embodiment, electrons flow from the second region 34 to the first cathode 20. Thus, under typical reverse biased operating circumstances, when a negative voltage is applied to the anode electrode 46, the PN junction 19 between the substrate 12 and drift layer 14 is forward biased and current conduction is achieved. High impedance insulated gate control of the device 10 is maintained under forward bias device operating conditions wherein a positive voltage is applied to the anode 46 and a negative voltage is applied to the second cathode 45 and the first cathode 20, because the vertical diode is reverse biased and no significant portion of the forward current flows through the vertical diode.

High impedance insulated gate control of the device 10 is provided during forward bias operation by an insulated gate structure 60 which is disposed over the third region 42 and preferably also extends over portions of the drift layer 14 and the fourth region 44. In response to an appropriately applied bias, the insulated gate 60 establishes a channel within the third region 42 for conductively coupling opposite type conductivity carriers between the cathode electrode 45 through the fourth region 44 and the gate induced channel to the drift region 14, the buffer region 15 and thence to the second region 34 and the anode electrode 46. Further, in response to removal of the bias potential from the insulated gate electrode 60, the insulated gate electrode 60 represses the channel and turns the device off. In response to an appropriate applied bias, the channel also supplies opposite type carrier current to the drift layer 14 which can also function as the base of a vertical bipolar transistor which is shown as a vertical PNP transistor comprising the P type first region 32, N type the buffer region 15 and drift layers 14 drift layer 14 and 15 respectively, and the P type substrate 12. A substantial portion of the overall device current can flow through this vertical transistor when the first cathode 20 is biased more negative than the anode 30.

The insulated gate structure 60 includes an insulation layer 62 which spaces the gate electrode 64 from the body of semiconductor material. The insulation layer 62 may be an oxide of a semiconductor which, in the illustrated example, can be a silicon dioxide layer 62 disposed over a portion of the third region 42 extending between the fourth region 44 and the drift layer 14. The insulation layer 62 can overlap onto the fourth region 44 and the drift layer 14. A gate electrode 64 is disposed atop the insulation layer 62 and can advantageously comprise a a polycrystalline silicon material, such as a polysilicon material, or a silicide material, such as polysilicide material. The gate electrode 64 can be substantially coextensive with the insulation layer 62 and can, along with insulation layer 62, extend over a portion of the third region 42 abutting the drift layer 14 and the fourth region 44 or alternatively, can overlie the insulation layer 62 and extend therewith over portions of the fourth region 44 and drift layer 14 as well as the third region 42.

Figure 4:
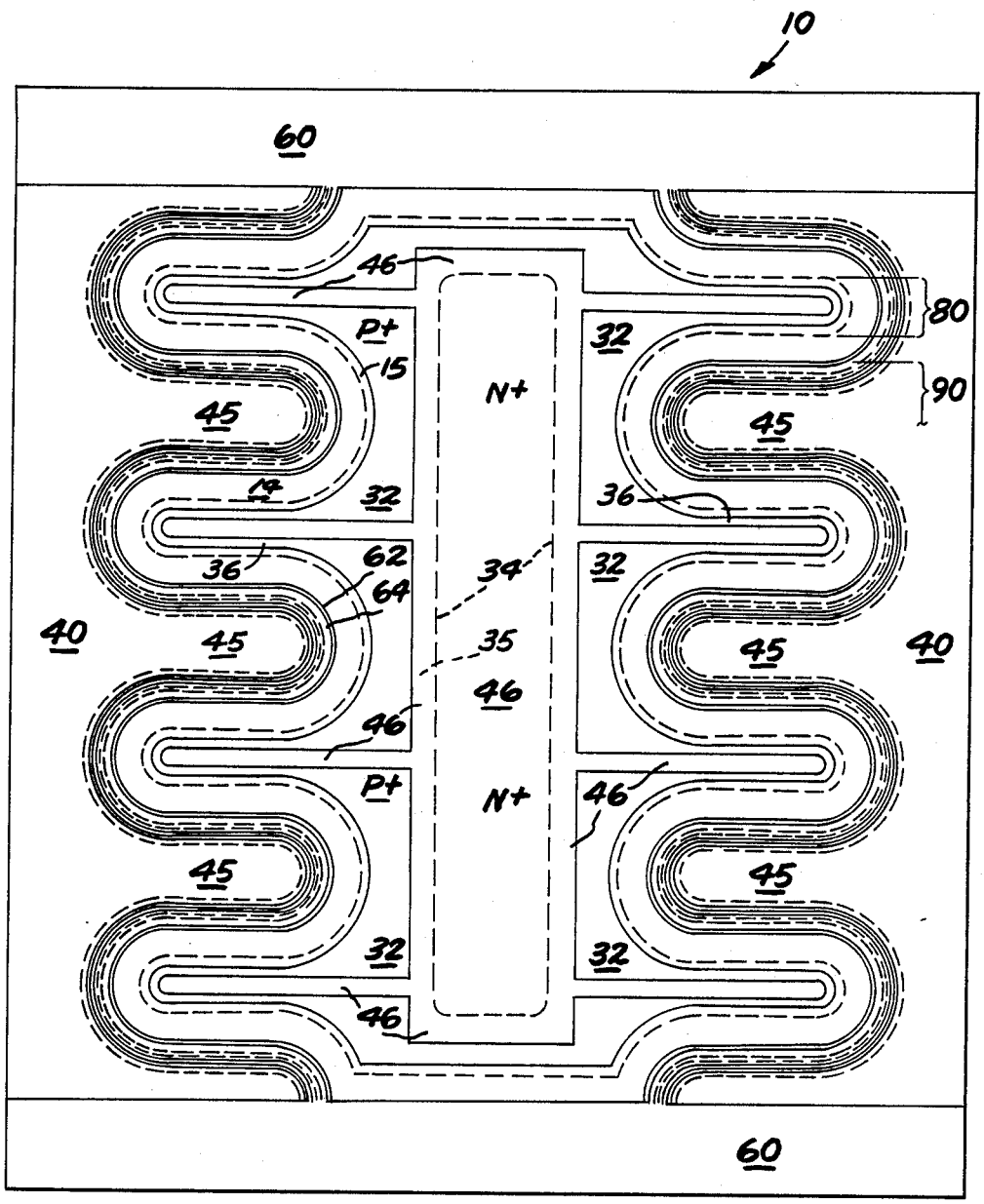
FIG. 4 is a top plan view of a lateral insulated gate transistor with dual function anode and vertical integral diode in accordance with the present invention.
Figure 5:
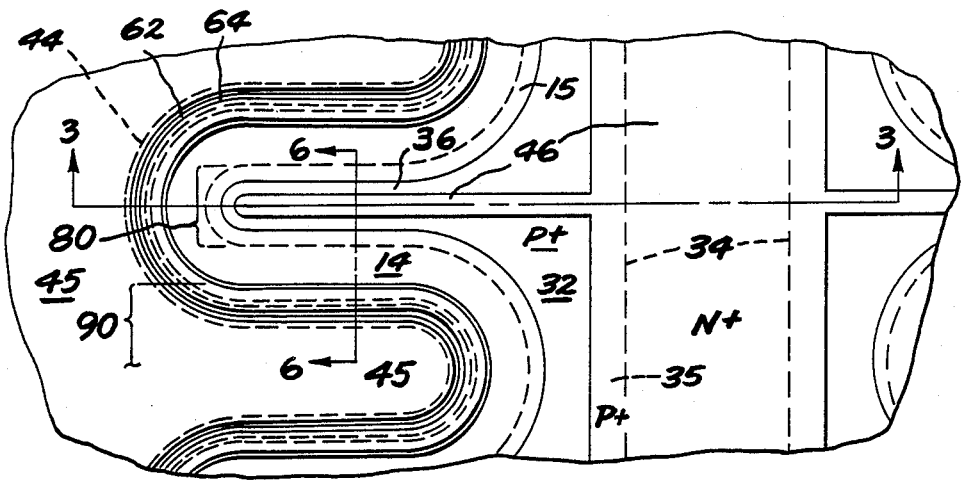
FIG. 5 is an enlarged illustration of a portion of the top plan view of FIG. 4.

Referring now to FIG. 4 and the enlarged portion of FIG. 4 shown in FIG. 5, an improved conductivity lateral insulated gate transistor with dual function anode and vertical integral diode 10 of the present invention is shown in top plan view. More particularly, the first region 32 is shown to be disposed within the buffer region 15, the boundary of which is shown by a dashed line, and about the periphery of the second region 34.

A plurality of second cathode fingers 90 are interdigitated with a plurality of anode fingers 80. The structure of each finger is shown in more detail in FIG. 6 below. In a preferred embodiment and as discussed in connection with FIG. 6 below, a substantial portion of the insulated gate current is established between the interdigitated portions 80 and 90 of the anode and cathode portions 30 and 40 respectively (shown in FIG. 3), of the device 10. As shown in FIG. 4, the cathode electrode 45 and the insulated gate 60 follow a serpentine configuration surrounding the fingers 36 of the first region 32. Further, it is to be noted, that inasmuch as the first and second regions 32 and 34 respectively, are shorted together by anode electrode 46, the central portion 35 of the first region 32 (shown in FIG. 3), does not make a substantial contribution to the conductivity of the device 10 under forward bias conditions.

Figure 6:
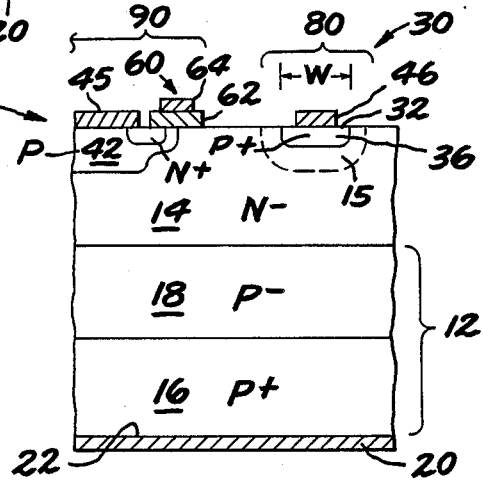
FIG. 6 is a cross-sectional illustration of an improved lateral insulated gate transistor with dual function anode and vertical integral diode in accordance with the present invention, taken along line 6—6 of FIG. 5.

An especially clear understanding of the structure of this device can be obtained when FIG. 5 is considered in connection with FIG. 6, which is a vertical cross-sectional illustration of the device of FIG. 5 taken along lines 6—6 of FIG. 5. The anode appendage 80 of the first region 32 is located proximate and is closely associated with the opposed second electrode cathode 40 of the device 10 which as shown can also be considered to be configured as a finger-like appendage 90 which is interdigitated with the anode appendage 80. The anode appendage 80 is useful to establish minority carrier injection from the first region 32 into the drift layer 14 to facilitate conduction between the anode and cathode regions 30 and 40 respectively, of the device 10. Specifically, the appendage 36 of the first region 32 is disposed proximate the device cathode 40 to increase the carrier concentration in the portion of the drift layer 14 disposed therebetween and to reduce the drift layer resistance and to facilitate carrier flow between interdigitated portions of the anode and cathode electrodes of the device. Thus the region of the drift layer 14 between the interdigitated electrodes is flooded with minority carriers and fully supports bipolar conduction between the opposed appendages 80 and 90 as shown in FIG. 6. It should, however, be remembered that the forward biased state of the first region 32 is achieved by the voltage drop established by the opposite type carrier flow along a path substantially parallel to the appendage 80 as discussed above in connection with FIG. 3.

A preferred embodiment of the present invention can be fabricated with the information provided by the below table which lists the dimensions of various regions in relation to their doping concentrations/conductivities.

| Region/Layer | Thickness/Depth | Doping Concentration |
| --- | --- | --- |
| substrate 16 | 250 microns | $1 \times 10^{19}$ cm$^{-3}$ |
| substrate 18 | 50 microns | $1 \times 10^{14}$ cm$^{-3}$ |
| drift | 5 microns | $2 \times 10^{15}$ cm$^{-3}$ |
| buffer region | 4 microns | $1 \times 10^{17}$ cm$^{-3}$ |
| 1st region | 1 micron | $1 \times 10^{19}$ cm$^{-3}$ |
| 2nd region | 1 micron | $1 \times 10^{19}$ cm$^{-3}$ |
| 3rd region | | |
| central portion | 4 microns | $1 \times 10^{19}$ cm$^{-3}$ |
| 3rd region appendage | 3 microns | $1 \times 10^{17}$ cm$^{-3}$ |
| 4th region | 1 micron | $1 \times 10^{19}$ cm$^{-3}$ |

In operation, the first and second cathode electrodes 20 and 45 respectively, are maintained at ground or reference potential. Typically, the anode electrode 46 is positively biased with a potential of approximately 2 volts. In response to an appropriate gate potential of approximately 15 volts applied to the gate electrode 60, a channel of opposite type conductivity is established in the third region 42 for conductively coupling the fourth region 44 to the drift layer 14 to facilitate the flow of opposite type conductivity carriers, illustrated as electrons in the embodiment, from the fourth region 44 through the third region 42, the drift layer 14, thence to the second region 34 and to the anode electrode 46. As opposite type conductivity or majority carriers continue to flow from the cathode 40 to the anode 30, a potential drop is developed along the drift layer 14. Once this potential drop exceeds approximately 0.7 volts, the PN junction 37 between the first region 32 and the drift layer 14 is forward biased causing the first region 32 to inject one type conductivity or minority carriers (holes, in the illustrated embodiment) into the drift layer 14 to enhance the lateral conductivity between the second cathode region and the anodes 90 and 80, respectively as well as vertical conductivity between the first cathode electrode 20 and the anode 30. While this minority carrier injection mechanism has been recognized to occur in prior lateral insulated gate transistor devices, it is important to recognize that this minority carrier injection mechanism occurs very efficiently in the device of the present invention despite the inclusion of the aforedescribed vertical integral diode between the substrate cathode electrode and the anode, to thereby achieve a high magnitude of gate controlled current flow between the cathode 40 and the anode 30 under forward bias conditions which correspond to operation in the first quadrant in FIG. 7 which is discussed below and full diode type current flow under reverse bias conditions which correspond to operation in the third quadrant in FIG. 7.

Figure 7:
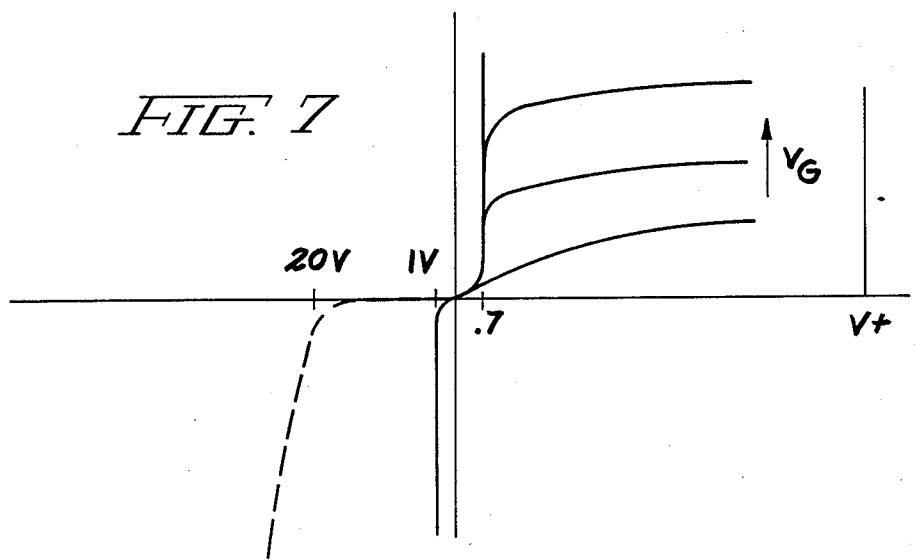
FIG. 7 is an illustration of the current-voltage operating characteristic of the lateral insulated gate transistor with dual function anode and vertical integral diode in accordance with the present invention.

FIG. 7 is an illustration of an operating characteristic of the insulated gate transistor with integral vertical diode of the present invention. Under forward bias conditions, the device exhibits an on-state knee of approximately 0.7 volts and once the voltage knee has been exceeded, the device turns on in response to the application of an appropriate gate bias potential with higher level of gate bias potential providing increased levels of current flow.

Under reverse bias conditions, the insulated gate transistor of the present invention also conducts current once an on-state knee of approximately 0.7 volts has been exceeded. The reverse bias operation of the present invention is significantly different from reverse biased characteristics of conventional devices shown by a dashed representation in FIG. 7. Thus conventional lateral insulated gate transistors exhibit a reverse blocking characteristic and do not exhibit a reverse conducting characteristic. A conventional insulated gate transistor breaks down at a reverse potential in excess of a prespecified voltage, such as approximately 20 volts. The breakdown mode of device operation can damage the device and cannot reliably be used for prolonged periods of operation.

The improved lateral insulated gate transistor in accordance with the present invention can be fabricated by employing conventional diffusion or implantation techniques to establish the above specified regions with the substrate. In a preferred embodiment as shown in FIGS. 3-6, a method of forming an insulated gate transistor exhibiting improved current conductivity in accordance with the present invention includes the steps of providing substrate 12 of one type conductivity which, in a preferred embodiment, comprises a heavily doped first layer 16 of the one type conductivity, such as P type conductivity, and a second, lightly doped, one type conductivity layer 18 disposed thereon. A first lightly doped drift layer 14 of the opposite type conductivity is then formed on the substrate 12 by, for instance, epitaxial growth. A buffer region 15 of opposite type conductivity is then formed within the lightly doped drift layer 14 by, for instance, either implantation or diffusion doping. A first region 32 of the one type conductivity is established in the drift layer 14 and preferably within the buffer region 15 by, for instance either implantation or diffusion doping. The first region 32 forms a portion of the substantially planar second surface 24 of the device. A second region 34 of the opposite type conductivity is established in the first region 32 by, for instance either implantation or diffusion doping, and the buffer region 15 and the second region 34 form a portion of the substantially planar second surface 24 of the device 10. A third region 42 of the one type conductivity is established in the drift layer 14 by, for instance either implantation or diffusion doping and, the third region forms a portion of the substantially planar second surface 24 of the device 10. A fourth region 44 of the opposite type conductivity is established in the third region 42 by, for instance either implantation of diffusion doping and the fourth region 44 forms a portion of the substantially planar second surface 24 of the device 10. A channel portion of the third region extends between fourth region 44 and the first layer 14 proximate the second surface 24. A cathode electrode 45 such as aluminum is deposited in registry with, and in ohmic contact with, a portion of the third and fourth regions. An insulation layer 62 is grown over the channel portion of the third region 42 and a gate electrode layer 64 is applied over the insulation layer 62 and at least coextensive with the channel portion of the third region 42. A metallized electrode 20 is applied in contact with the substrate 12 by, for instance, vacuum deposition and is electrically connected to the second cathode electrode 45. A third metallized (anode) electrode 46 is applied by, for instance, vacuum deposition to establish electrical contact with said first and second regions 32 and 34, respectively.

While the preferred embodiments of the present invention have been disclosed with respect to a lateral insulated gate transistor, it will be recognized that the dual function anode vertical integral diode teaching of the present invention is not so limited, but is equally applicable to other lateral insulated gate devices. Further, it will be recognized that the inclusion of a vertical integral diode within lateral insulated gate devices provides not only for improved current conductivity, but also other enhancements such as reduced cell size, improved conductivity, reduced-on resistance, and thus improved operating characteristics and device parameters of the device as a whole.

While the preferred embodiments of the present invention have been illustrated and described, it is clear that the invention is not so limited. Numerous modifications and changes, variations and substitutions and equivalents will occur to those skilled in the art without departing from the true spirit and scope of the present invention. Accordingly, it is intended that the invention herein be limited only by the scope of the appended claims.

What is claimed is:
1. A lateral insulated gate semiconductor device including:
 a body of semiconductor material comprising:
  a substrate of one type conductivity having a first surface which comprises a first major surface of said body,
  a first layer of opposite type conductivity disposed on an opposed major surface of said substrate;

a first region of said one type conductivity disposed within said first layer and comprising a first portion of a second, opposed major surface of said body and forming a first PN junction with said first layer, a second region of said opposite type conductivity disposed within said first layer, comprising a second portion of said second surface of said body, being more heavily doped to said opposite conductivity type than said first layer and, at said second surface of said body, being surrounded by said first region, a third region of said one type conductivity disposed within said first layer, spaced from said first region and comprising a third portion of said second surface of said body, a fourth region of said opposite type conductivity disposed within said third region and comprising a fourth portion of said second surface of said body and forming a second PN junction with said third region, said first layer comprising a fifth portion of said second surface, said first region including laterally extending appendages which extend toward said third region, said second region being spaced from said first region appendages, said third region including laterally extending appendages which extend toward said first region and are interdigitated with said first region appendages;

each of said first region appendages having a length L and a width W, such that the ratio of L to W is sufficient to effect a voltage drop in excess of 0.7 volts between said each appendage and an adjacent portion of said first layer in response to an on-state gate voltage and an anode-to-cathode voltage in the vicinity of and greater than 0.7 volts;

a first cathode electrode disposed in ohmic contact with said substrate on said first surface thereof;

an insulated gate disposed atop said second surface of said body above a portion of said third region and responsive to an appropriate bias for establishing a channel through said third region for coupling opposite type conductivity carriers from said fourth region through said third region to said first layer;

a second cathode electrode disposed in ohmic contact with said third and fourth regions and shorting said third region to said fourth region to inhibit forward biasing of said second PN junction;

an anode electrode disposed in ohmic contact with said first and second regions; and means connecting said second cathode electrode to said first cathode electrode so as to permit current flow through a vertical diode comprising said substrate, said first layer and said second region in response to the application of a bias potential across said first cathode electrode and said anode electrode in a polarity to forward bias said diode.

2. The insulated gate semiconductor device of claim 1 wherein said substrate comprises a heavily doped layer of said one type conductivity adjacent said first surface and a lightly doped layer of said one type conductivity extending from said heavily doped layer to said second surface of said substrate.

3. The insulated gate semiconductor device of claim 1 wherein said insulated gate comprises an insulation layer disposed on said second surface of said body covering said portion of said third region and being adjacent said fourth region and a gate electrode overlying a portion of said insulation layer and said portion of said third region.

4. The insulated gate semiconductor device of claim 1 wherein said first layer is lightly doped.

5. The insulated gate semiconductor device of claim 1 wherein said second region is heavily doped and extends through said first region to a depth greater than the depth of said first region, said first and second regions forming a PN junction which is an extension of said first PN junction.

6. The insulated gate semiconductor device of claim 1 wherein said ratio of L to W is approximately equal to 25.

7. The insulated gate semiconductor device of claim 1 wherein said first region appendages are approximately parallel to each other.

8. The insulated gate semiconductor device of claim 1 wherein said first and third regions include portions arranged in side by side relation.

9. The insulated gate semiconductor device of claim 8 wherein said fourth region is disposed in side-by-side, spaced apart relation with a portion of said first region.

10. The insulated gate semiconductor device of claim 9 wherein said second region is entirely situated beneath said anode electrode.

11. A lateral insulated gate semiconductor device including:
a body of semiconductor material comprising:
a substrate of one type conductivity having a first surface which comprises a first major surface of said body;
a first layer of opposite type conductivity disposed on an opposed surface of said substrate;
a first region of said one type conductivity disposed within said first layer and comprising a first portion of a second, opposed major surface of said body and forming a first PN junction with said first layer,
a second region of said opposite type conductivity disposed within said first layer, comprising a second portion of said second surface of said body, being more heavily doped to said opposite conductivity type than said first layer and, at said second surface of said body, being surrounded by said first region,
a third region of said one type conductivity disposed within said first layer, spaced from said first region and comprising a third portion of said second surface of said body,
a fourth region of said opposite type conductivity disposed within said third region and comprising a fourth portion of said second surface of said body and forming a second PN junction with said third region,
said first layer comprising a fifth portion of said second surface,
said first region including laterally extending appendages which extend toward said third region, said second region being spaced from said first region appendages, said third region including laterally extending appendages which extend toward said first region and are interdigitated with said first region appendages;

a first cathode electrode disposed in ohmic contact with said substrate on said first surface thereof;

an insulated gate disposed atop said second surface of said body above a portion of said third region and responsive to an appropriate bias for establishing a channel through said third region for coupling opposite type conductivity carriers from said fourth region through said third region to said first layer;

a second cathode electrode disposed in ohmic contact with said third and fourth regions and shorting said third region to said fourth region to inhibit forward biasing of said second PN junction;

an anode electrode disposed in ohmic contact with said second region and said first region, including said laterally extending appendages of said first region;

means connecting said second cathode electrode to said first cathode electrode so as to permit current flow through a vertical diode comprising said substrate, said first layer and said second region in response to the application of a bias potential across said first cathode electrode and said anode electrode in a polarity to forward bias said diode.

12. The lateral insulated gate semiconductor device recited in claim 11 wherein said portions of said anode electrode disposed in ohmic contact with said appendages of said first region comprise appendages of said anode electrode.

13. The lateral insulated gate semiconductor device recited in claim 11 wherein said ohmic contact between said anode electrode and said first region appendages extends substantially the full length of said first region appendages.

14. The lateral insulated gate semiconductor device recited in claim 13 wherein said portions of said anode electrode disposed in ohmic contact with said appendages of said first region comprise appendages of said anode electrode.

15. The insulated gate semiconductor device of claim 11 wherein said substrate comprises a heavily doped layer of said one type conductivity adjacent said first surface and a lightly doped layer of said one type conductivity extending from said heavily doped layer to said second surface of said substrate.

16. The insulated gate semiconductor device of claim 11 wherein said insulated gate comprises an insulation layer disposed on said second surface of said body covering said portion of said third region and being adjacent said fourth region and a gate electrode overlying a portion of said insulation layer and said portion of said third region.

17. The insulated gate semiconductor device of claim 11 wherein said first layer is lightly doped.

18. The insulated gate semiconductor device of claim 11 wherein said second region is heavily doped and extends through said first region to a depth greater than the depth of said first region, said first and second regions forming a PN junction which is an extension of said first PN junction.

19. The insulated gate semiconductor device of claim 11 wherein each of said first region appendages has a length L and a width W, such that the ratio of L to W is sufficient to effect a voltage drop in excess of 0.7 volts between said each appendage and an adjacent portion of said first layer in response to an on-state gate voltage and an anode-to-cathode voltage in the vicinity of and greater than 0.7 volts.

20. The insulated gate semiconductor device of claim 19 wherein said ratio of L to W is at least approximately 25.

21. The insulated gate semiconductor device of claim 11 wherein said first region appendages are approximately parallel to each other.

22. The insulated gate semiconductor device of claim 11 wherein said first and third regions include portions arranged in side-by-side relation.

23. The insulated gate semiconductor device of claim 22 wherein said fourth region is disposed in side-by-side, spaced apart relation with a portion of said first region.

24. The insulated gate semiconductor device of claim 23 wherein said second region is entirely situated beneath said anode electrode.

* * * * *